United States Patent
Vianen et al.

(10) Patent No.: US 7,927,894 B2
(45) Date of Patent: Apr. 19, 2011

(54) APPARATUS FOR ALIGNING AN OPTICAL DEVICE AN OBJECT, AN OPTICAL INSTRUMENT AND A SEMICONDUCTOR PROCESS SYSTEM

(75) Inventors: Job Vianen, Nijmegen (NL); Jozef P. W. Stokkermans, Nijmegen (NL)

(73) Assignee: NXP B.V., Eindhoven (NL)

( * ) Notice: Subject to any disclaimer, the term of this patent is extended or adjusted under 35 U.S.C. 154(b) by 342 days.

(21) Appl. No.: 12/161,770

(22) PCT Filed: Feb. 1, 2007

(86) PCT No.: PCT/IB2007/050339
§ 371 (c)(1),
(2), (4) Date: Jul. 22, 2008

(87) PCT Pub. No.: WO2007/091196
PCT Pub. Date: Aug. 16, 2007

(65) Prior Publication Data
US 2010/0223767 A1 Sep. 9, 2010

(30) Foreign Application Priority Data
Feb. 10, 2006 (EP) .................................. 06101552

(51) Int. Cl.
*H01L 21/00* (2006.01)
*G01N 21/00* (2006.01)

(52) U.S. Cl. ................ 438/16; 257/E21.527; 356/237.5
(58) Field of Classification Search ................... 438/16; 257/E21.527; 356/237.5
See application file for complete search history.

(56) References Cited

U.S. PATENT DOCUMENTS

| 3,854,687 A | 12/1974 | Sick |
| 5,096,291 A * | 3/1992 | Scott ............................ 356/244 |
| 5,135,196 A | 8/1992 | Schehr |

FOREIGN PATENT DOCUMENTS

| DE | 9105839 U1 | 7/1991 |
| JP | 08124195 A | 5/1996 |
| WO | 2004055870 A1 | 7/2004 |
| WO | 2004064124 A | 7/2004 |

* cited by examiner

Primary Examiner — W. David Coleman

(57) ABSTRACT

The present invention relates to an apparatus (10) for aligning an optical device with an object. The apparatus comprises, a frame (12), a support unit (16) for supporting said optical device or said object and a transportation device (14) arranged to at least tilt the support unit in relation to the frame, wherein a segment of a sphere (18, 22) is provided, which segment defines a spherical surface (20), and the tilting movement of the support unit is controlled by said spherical surface. The apparatus according to the invention allows for a tilting movement between said optical device and said object, while such movement does not lead to a shift in focus. Furthermore the invention relates to an optical instrument and a semiconductor process system comprising said apparatus.

15 Claims, 5 Drawing Sheets

APPARATUS FOR ALIGNING AN OPTICAL DEVICE AN OBJECT, AN OPTICAL INSTRUMENT AND A SEMICONDUCTOR PROCESS SYSTEM

The present invention relates to an apparatus according to the preamble of claim 1.

The present invention furthermore relates to an optical instrument and a semiconductor process system.

An apparatus as referred to in the first paragraph is commonly known. The support unit normally holds an assembly of lenses, such as a camera. The apparatus generally is mounted with its frame to some kind of microscopic instrument, which instrument accommodates an object to be examined or viewed. Normally the object can also move by means of a stage of some kind that translates or rotates the object with relation to apparatus.

Figure 1:
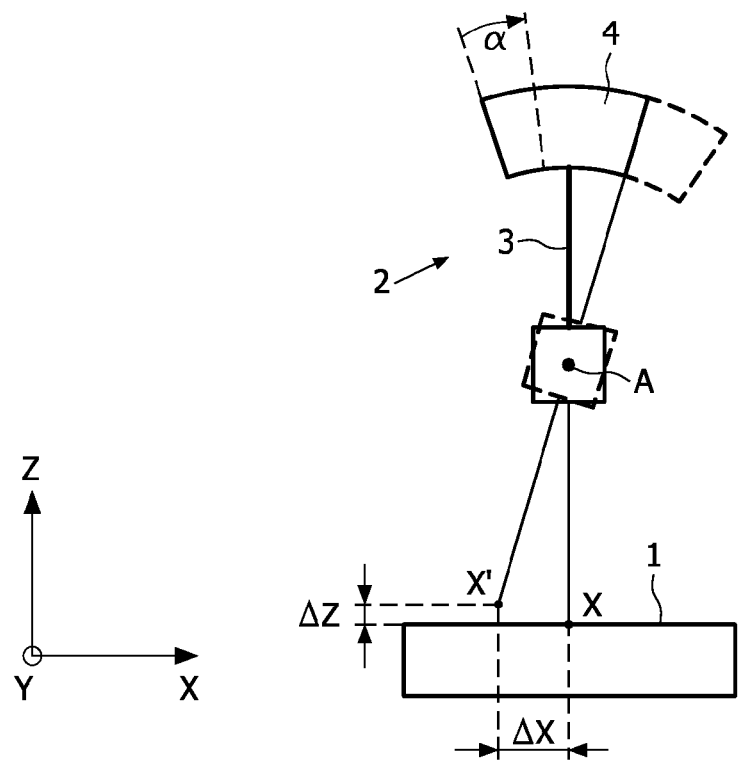

FIG. 1 is a schematic view of a microscopic or optical instrument according to the prior art. First an object 1 to be examined is shown. A known apparatus 2 for optically aligning an optical device and an object is disposed above the object, which apparatus comprises a support unit 3. A camera 4 is mounted to the support unit 3, as it is schematically illustrated in FIG. 1. The term 'camera' is used herein to indicate any type of optical device. Generally the object 1 can translate in at least two directions x and y (y-direction is perpendicular to drawing surface) with relation to the camera 4, for example by accommodating the object in some kind of stage (not shown) that performs linear movements. Such movements are used to align a specific spot of the object with the camera 4. The apparatus 2 normally is also arranged to translate the camera 4 in a third direction, corresponding to the z-direction. One uses this translational movement to focus the object with relation to the camera. The focus point is situated on the optical axis O of the camera 4 and is indicated by point X at the surface of the object 1.

Besides translational movement in the z-direction, the apparatus 2 is adapted to tilt the camera 4 about an axis of rotation. Such tilting movement is necessary for example to view the object 1 under a different angle or to make way for another device or tool whenever a clear path between such other device or tool and the object is required. Furthermore tilting can be required for optimizing the quality of the image or to compensate for mechanical tolerances. In the optical instrument from FIG. 1 such tilting movement is obtained by tilting the camera about a certain axis of rotation A with a rotation angle α. The position of the camera after tilting is schematically illustrated by dotted lines. As indicated by the new focus point X' in FIG. 1 such tilting movement results in both a shift Δy in y direction and a shift Δz in z-direction. This means that after tilting it, the camera 4 will be out of focus and be looking at a different spot of the object or does not even reach the object anymore.

It is an object of the present invention to provide an alignment apparatus that allows a tilting movement between an optical device and an object, in which such movement does not lead to a shift in focus.

To achieve this object an apparatus for aligning an optical device and an object according to the present invention is characterized in that, a segment of a sphere is provided, which segment defines a spherical surface, and that the tilting movement of the support unit is controlled by said spherical surface.

Figure 2:
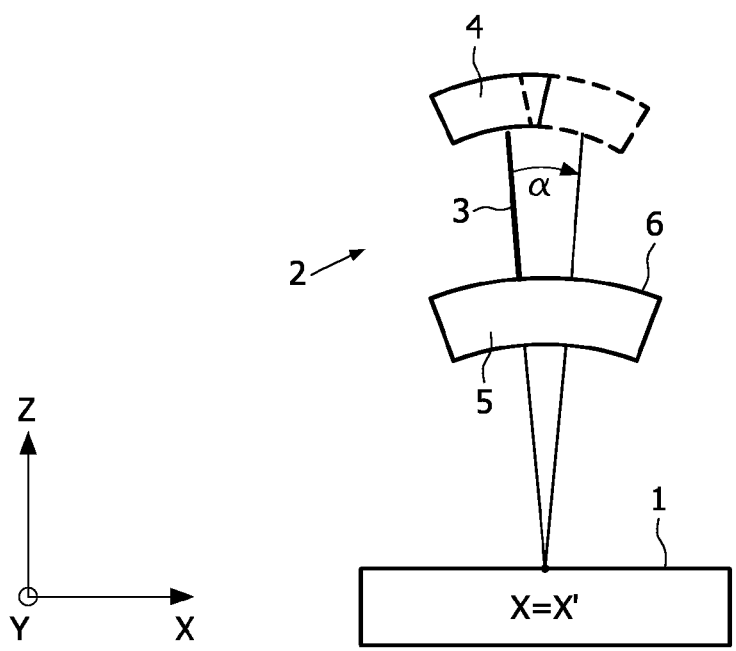

The present invention can best be explained referring to FIGS. 1 and 2. It is noted that like reference numbers refer to like parts in all drawings. FIG. 1 is a schematic view of an optical instrument according to the prior art and has been described above. FIG. 2 is a schematic view of an optical instrument illustrating the principle of the present invention. In this Figure it is indicated that a camera 4 tilts in relation to the object 1 with a rotation angle α. The apparatus comprises a segment of a sphere 5, which segment defines a spherical surface 6. A tilting movement of the camera 4 together with the support unit 3 is controlled by this spherical surface 6, since support unit 3 in this embodiment moves along the spherical surface 6. By ensuring that the center of the imaginary sphere, of which the surface partially overlaps with the spherical surface 6, coincides with the focus point of the camera X, such tilting movement will not lead to any shift of focus point X as regards to object 1. Due to this measure tilting the support unit 3 together with the camera 4 will by definition not result in any shift of the corresponding focus point. Thus with the alignment apparatus 2 from FIG. 2 the focus point X before tilting coincides with the focus point X' after tilting. As will be clear to a man skilled in the art, the principle here is that the axis of rotation A, which axis corresponds to the tilting movement actually intersects the optical axis O and O' at the focus point X, X'. In the schematic example of FIG. 2 the axis of rotation is perpendicular to the surface of the drawing. However it will be clear that when the spherical segment is properly dimensioned, tilting over any other axis of rotation without any unwanted shifting is possible provided such axis of rotation extends through focus point X and is perpendicular to the optical axis. Here 'Properly dimensioned' means that the surface 6 should have sufficient dimensions to allow a significant tilting movement. It will be clear that with an appropriate construction of the segment of a sphere 5 and the support unit 3 it is possible to tilt the camera about various axis of rotation without any unwanted shifts in focus point.

It will be clear that reversal of the mutual positions of the camera and the object does not influence the proper functioning of neither the apparatus nor the principle of the present invention.

Therefore the present invention provides a simple apparatus that enables to mutually tilt an optical device and an object about an axis of rotation, while preventing any shifts in focus between them.

In a preferred embodiment a first segment of a sphere and a second segment of a sphere are provided, the first segment of a sphere defining a first spherical surface and the second segment of a sphere defining a second spherical surface, the center of the sphere corresponding to the first spherical surface substantially coincides with the center of the sphere corresponding to the second spherical surface, and the first and the second spherical surface are movable with relation to each other. This embodiment facilitates the movement of the support unit with relation to a segment of a sphere. It is especially preferred when a first spherical surface couples with the second spherical surface when the first and the second segment move with relation to each other. In this way the use of a complicated bearing can be circumvented. Furthermore it is advantageous when the frame comprises the first segment of a sphere and the transportation device comprises the second segment of a sphere, and the second spherical surface is movable along the first spherical surface. Both preferred embodiments provides a simple and effective design of the apparatus according to the present invention.

According to another preferred embodiment a locking device is provided, which locking device is arranged to respectively change the apparatus between a locked condition wherein the support unit is locked with relation to the frame and a released condition wherein the support unit is movable with relation to the frame. This embodiment enables to prevent any unwanted or premature movements by the support unit by changing the apparatus to the locked condition. Here it is advantageous that the locking device comprises a locking plate, which plate locks and releases the second segment of a sphere to the first segment of a sphere when changing to the locked condition and the released condition respectively. This provides a simple yet effective design of the locking device that can be operated manually.

The present invention also relates to an optical instrument comprising an apparatus according to one of the abovementioned embodiments and an assembly of lenses mounted to the support unit of said apparatus. Preferably the apparatus is mounted to a microscopic instrument with its frame, which instrument comprises a stage for holding an object, which stage is movable with relation to the assembly of lenses in at least one direction. The apparatus according to the invention can advantageously be applied in these types of optical instruments when one wants to tilt the assembly of lenses with relation to an object.

Furthermore the present invention relates to a semiconductor process system, which comprises;
a machine frame;
carrier for accommodating semiconductor components;
a tool to process the semiconductor components;
an apparatus according to one of the abovementioned embodiments, which apparatus is mounted to the process system with its frame;
an assembly of lenses mounted to the support unit of said apparatus.

Preferably the carrier of the semiconductor process system accommodates a wafer, which wafer is disposed on a foil and holds a plurality of semiconductor components, and the tool is a pick and place unit to pick the individual semiconductor components from the wafer and place them on an external member for packaging the semiconductor components.

Such a process system enables the control on the proper positioning of the semiconductor components, wherein one often applies a digital camera that is disposed in line with the assembly of lenses. The picture generated by the digital camera is used to control the tool that processes the semiconductor components. It is very important that the optical axis of the camera is perpendicular aligned with the corresponding semiconductor components. To this end it is important to be able to tilt the camera with respect to the observed components to correct for an unclear picture or a picture in which the left part for example is clearer than the right part. The latter can give difficulties when one applies picture recognition software to recognize the right component. Since semiconductor process systems in general do not leave much room to arrange for such tilting movement and through put time of processing the components is very important an apparatus according to the present invention can be advantageously applied for a semiconductor process assembly. The apparatus does not require much space and allows tilting of a camera mounted to it without a shift of its focus point.

The present invention can in particular be favorably applied in a chip-transfer apparatus as described in WO2004/64124 and in a wire bonding apparatus as described in WO2004/55870. Both international patent applications WO2004/06424 and WO2004/55870 are incorporated herein by reference.

By 'the sphere corresponding to the first/second spherical surface' as used herein it is meant an imaginary sphere, wherein the 'spherical surface' overlaps with a respective portion of the surface of said imaginary sphere.

Figure 3:
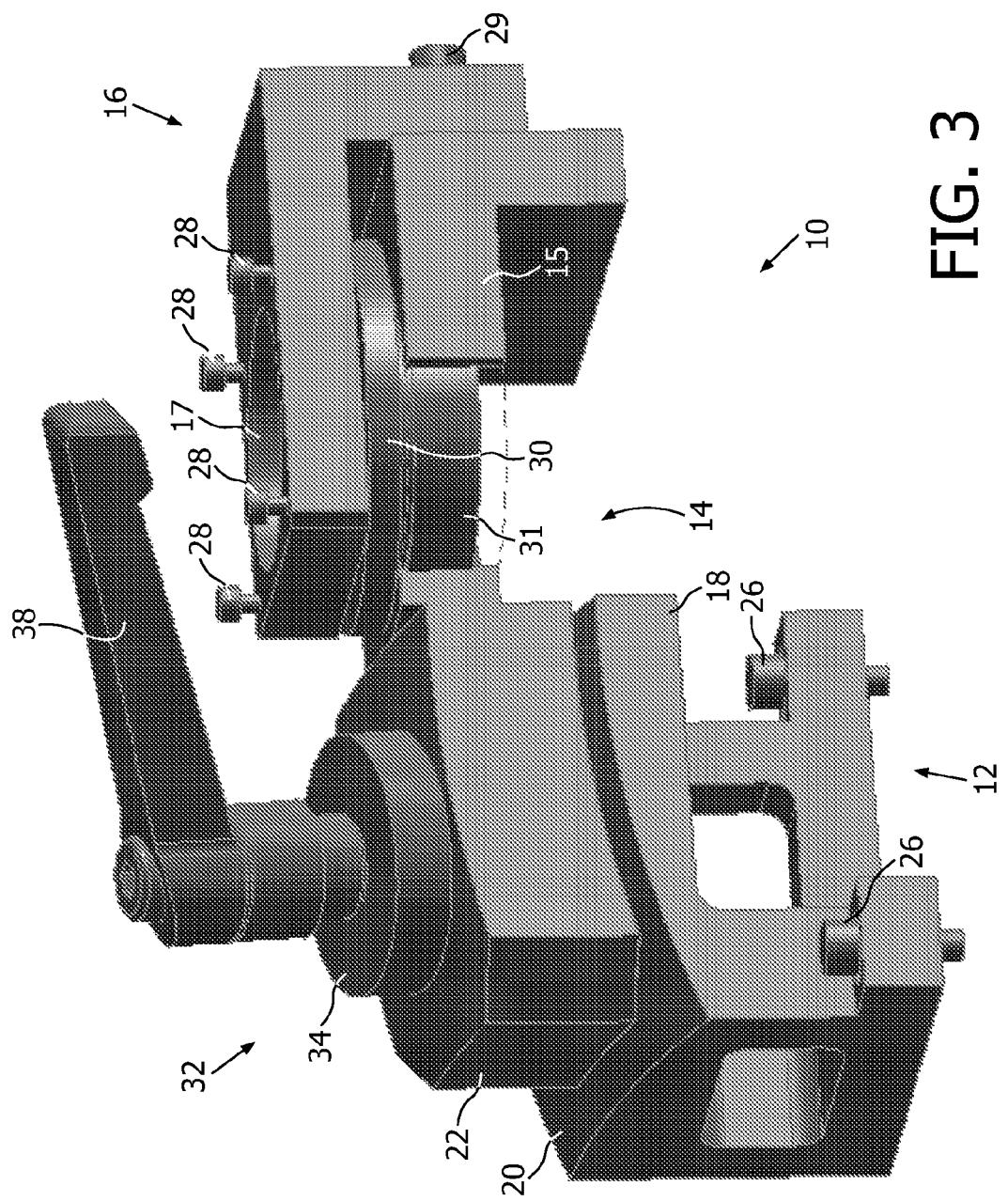
Figure 4:
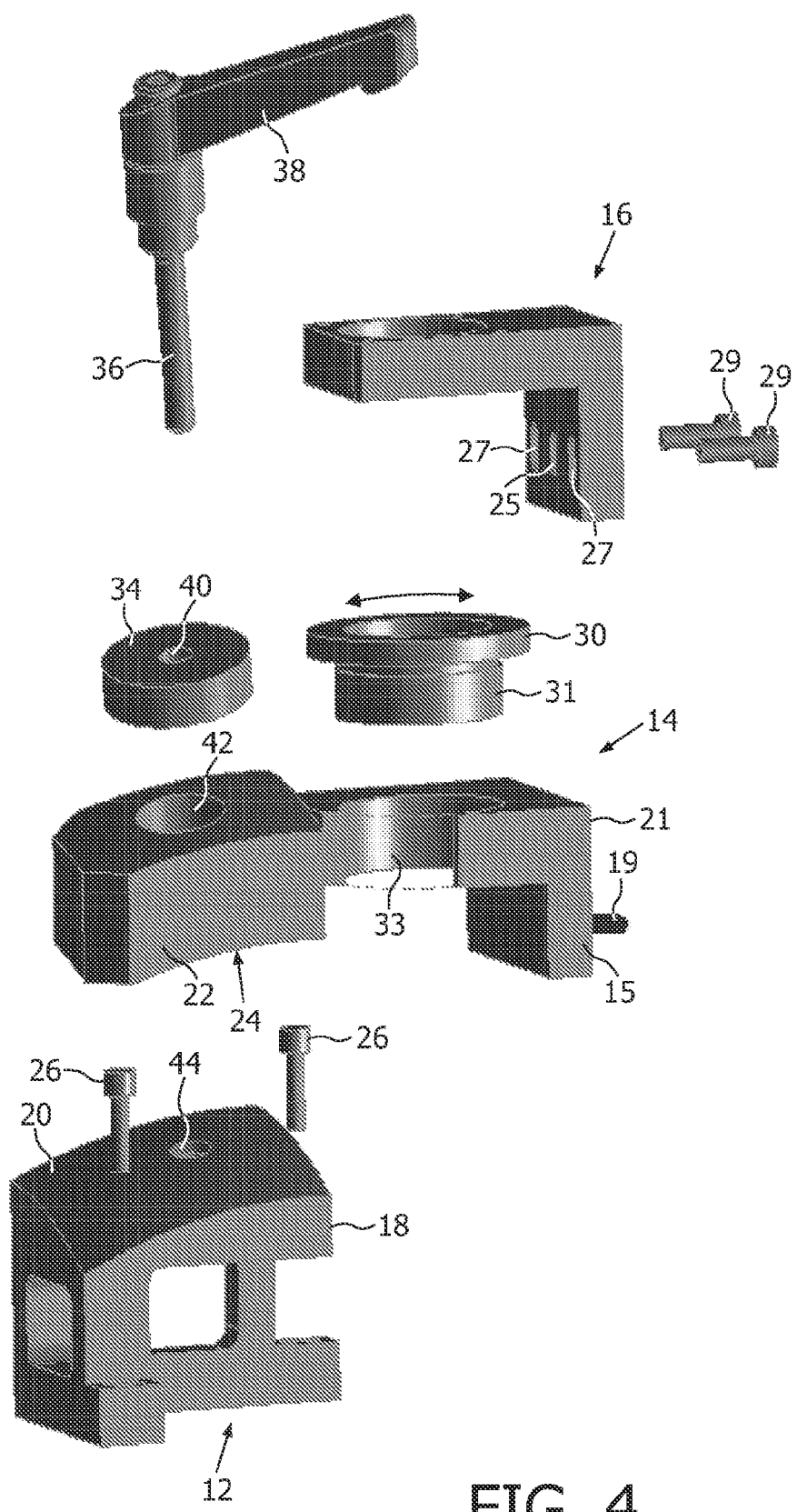
Figure 5:
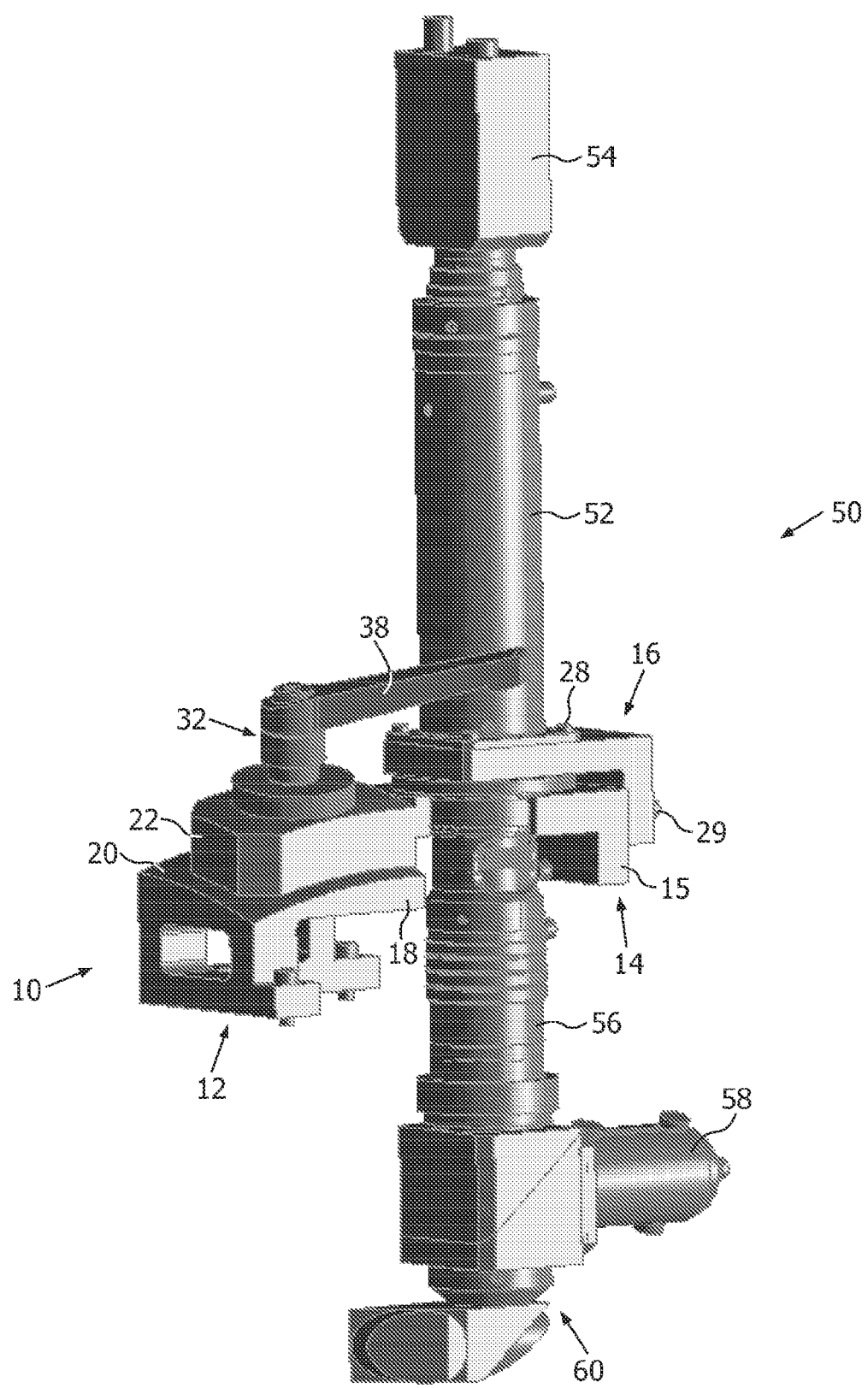
Figure 6:
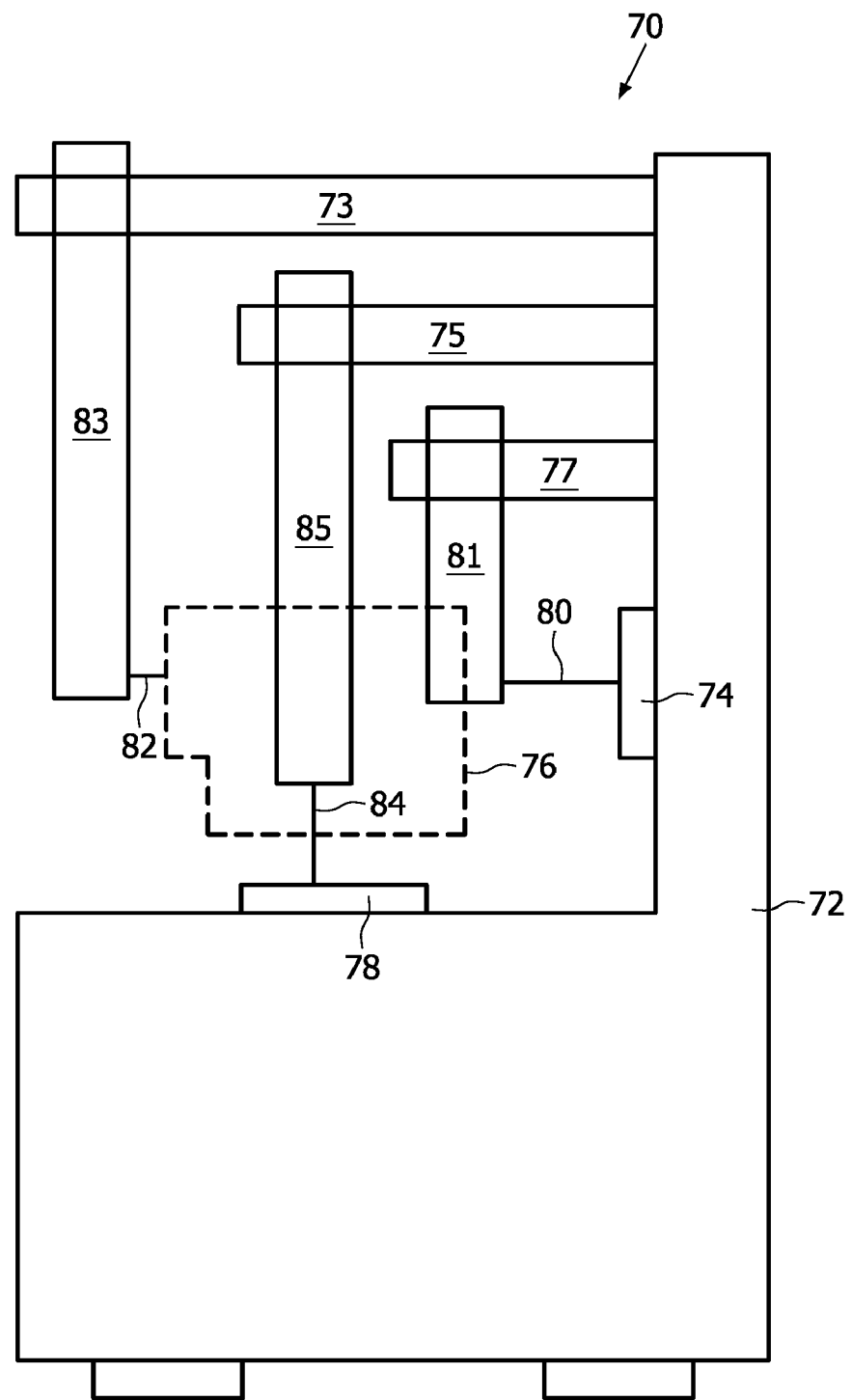

The invention will be further explained below with reference to the accompanying drawings, in which:

FIG. 1 is a schematic view of an optical instrument according to the prior art;
FIG. 2 is a schematic view of an optical instrument illustrating the principle of the present invention;
FIG. 3 is a perspective view of an apparatus according to a first embodiment;
FIG. 4 is a perspective exploded view of an apparatus according to the first embodiment;
FIG. 5 is a perspective view of an optical instrument;
FIG. 6 is a schematic view of a semiconductor process system.

As stated earlier like reference numbers refer to like parts in the drawings.

FIGS. 1 and 2 have been discussed in the introductory part of this description. These Figures serve to illustrate the principle of aligning an optical device and an object according to the prior art and the present invention respectively.

Referring now to FIGS. 3 and 4 an apparatus 10 according to a first embodiment of the present invention is shown in an assembled and exploded condition respectively. The apparatus comprises a frame 12, a transportation device 14 and a support unit 16. The support unit is adapted to support an optical device or an object to be examined and is mounted to the transportation device 14 as will be explained below. To have a free optical path of such a device or object the support unit is provided with a hole 17, while screws 28 are provided to allow the mounting of the device or object.

The transportation device 14 is provided with a cylindrical part 30, which part comprises a cylindrical casing 31 provided with thread on its outer surface (not shown). The cylindrical part 30 can rotate with relation to a body 15 of the transportation device 14. This rotating movement is enabled by thread provided on the inner surface of a cylindrical hole 33, which thread couples with the thread on the outer surface of the cylindrical casing 31. By rotating the cylindrical part 30 the support unit this unit will translate in the z-direction with relation to the transportation device 14, as will be clear from FIG. 4.

The support unit 16 in this embodiment is mounted to a side surface 21 of the body 15 by means of screws 29 or any other type of fastening means. Three parallel slots 25,27 enable the translating movement in the z-direction of the support unit 16 as follows. When the screws are detached one can manually rotate the cylindrical part 30, which rotation leads to the translating movement in the z-direction. During this movement a pin 19, which extends from the side surface 17 of the transportation device 14 couples with slot 25 and guides the translation of the support unit 16.

Although in this embodiment the support unit and transportation device are two separate parts, which is necessary so as to translate the support unit in the z-direction, it is also possible to have one integrated unitary part that functions both as support unit and transportation device. This becomes possible when relative movements between the transportation device and the support unit is not required.

The frame 12 comprises holes (not shown) to receive screws 26 in order to mount the frame to a microscopic instrument or any other type of optical instrument. Although this is not shown by releasing screws 26 it is possible to move the apparatus 10 with relation to such an instrument in a direction perpendicular to the Z-direction. Furthermore the frame 12 comprises a segment of a sphere 18, which defines a first spherical surface 20.

The transportation device 14 comprises a second segment of a sphere 22, which defines a second spherical surface 24. This surface 24 is disposed at the bottom side of the segment 22 and therefore is not visible in FIG. 4. The second spherical surface 24 of the transportation device 14 couples with the first spherical surface 20 of the frame 12. A locking device 32 is provided to respectively lock and release the second spherical surface 24 with relation to the first spherical surface 20, while movement between them is only possible in the released condition. The functioning of the locking device 32 will be explained in more detail below.

When the locking device 32 is in its released condition it is possible to move the transportation device 14 and the support unit 16 with relation to the frame 12. During such movement the second spherical surface 24 moves along the first spherical surface 20. Preferably both spherical surfaces are coated with a special coating to facilitate the mutual movement, which for example can be a coating to reduce the friction and wear between both surfaces, such as a Teflon coating or a nickel-Teflon coating.

When moving the second spherical surface 24 along the first spherical surface 20 causes the support unit to perform a tilting movement with relation to the frame. The corresponding movement can be actuated manually as will be discussed below. In connection with the principle illustrated with FIG. 2 and the corresponding description above it will be clear that the apparatus shown in FIGS. 3 and 4 enables to tilt an optical device mounted to the support unit 16 with relation to an object that is disposed on an instrument, which instrument is connected with the frame 12 of the apparatus without any focus shifts between the optical device and the object. The instrument for example comprises a stage or other type of x,y-table. It will be clear that this object can also be achieved when the position of the object and the device is reversed. That is the object is mounted to the support unit and the optical device is part of the instrument.

As is most clearly visible in FIG. 4 the locking device 32 comprises a locking plate 34 having a through hole 40 and an elongated member 36 provided with thread at least at an end portion thereof (not shown). The second segment of a sphere 22 comprises a through hole 42 and the first segment of a sphere 18 comprises a hole 44, which is provided with thread (not shown). The elongated member 36 extends through the hole 40 of the locking plate 34, the hole 42 of the second segment of a sphere 22 and extends in the hole 44 of the first segment of a sphere 18. The elongated member rotates with relation to the other components. When rotating the member 36 the thread at the end portion thereof couples with the thread in the hole 44 of the first segment of a sphere 18. To facilitate its rotating movement the member 36 comprises a handle 38. From FIG. 4 it will be clear that the diameter of the hole 42 in the second segment of a sphere 22 is considerably larger then the hole 44 in the first segment of a sphere 18.

The functioning of the apparatus according to the first embodiment is as follows. When starting from the locked condition of the locking device 32, one rotates the elongated member 36 counter-clockwise, which causes the locking plate to release the second segment 22 of a sphere from the first segment of sphere 18. This allows moving the second spherical surface 24 along the first spherical surface 20. The range of this movement is defined by the mutual difference in diameter between holes 42,44 in the first and the second segment of a sphere respectively. Therefore the diameter of the hole 42 in the first segment of a sphere 22 is a much larger than the diameter of the hole 44 in the first segment of a sphere 18, preferably at least three times as large. The apparatus can best be operated manually by grasping the handle 38 in one hand for operating the locking device 32 while grasping the body 15 of the transportation device and the support unit in the other hand for moving them along the first spherical surface 18.

FIG. 5 is a perspective view of an optical instrument 50, which comprises the apparatus as described before and an assembly of lenses 52 mounted to the support unit 16 of said apparatus by means of screws 28. On top of the assembly 52 a camera 54, preferably a digital camera is mounted. At the other side of the support unit 16 a second assembly of lenses 56 is mounted to the apparatus 10. At an end of this second assembly respectively a light source 58 and a mirror unit 60 are disposed. Jointly both assembly of lenses 52, 56, the light source 58, and the mirror unit 60 provide for the proper picture generated by the camera 54 as regards to an object that is facing the mirrors.

FIG. 6 is a schematic view of a semiconductor process system 70, which amongst others comprises a machine frame 72 and a wafer carrier 74, which accommodates a wafer disposed on a foil and holding a plurality of semiconductor components. Furthermore a pick and place unit 76 to pick the individual semiconductor components from the wafer and place them on an external member 78 is provided. The external member is a so-called taper, which comprises an elongated strip provided with a plurality of recesses extending in the longitudinal section of the strip. The taper is used to create a package for the individual semiconductor components and is applied to and from the system according to the so-called 'reel-to-reel-principle'. For reasons of clarity the pick and place unit 76 is shown in dotted lines.

The process system 70 is characterized by the presence of three optical instruments 81,83,85, which are more or less similar to the instrument 50 as described in the previous paragraph. Each of the instruments is mounted to the machine frame 72 by means of mounting parts 73,75,77 respectively. The mounting parts 73,75,77 are connected to the frame of the respective instrument. Each instrument has a specific function, which can be retrieved in FIG. 6 by observing the respective optical paths 80,82,84 as defined by the mirror unit of the corresponding optical instrument (see FIG. 5).

The optical instrument 81 corresponding to optical path 80 observes a wafer on the wafer carrier 74. The optical instrument 83 corresponding to optical path 82 observes a individual semiconductor component that has been picked up from the wafer by the pick and place unit 76, while the component is hold by a vacuum device. Finally the optical instrument 85 corresponding to optical path 84 observes the member 78 accommodating the semiconductor components places therein by the pick and place unit 76.

Regarding the differences of the optical paths 80,82,84 the translational movements and or the exact configuration of the mirror can be different for each of the optical instruments 81,83,85.

As noted before the semiconductor process system in general does not leave do not leave much room to arrange for the movement of the digital camera with relation to the semiconductor component. Furthermore in case of the optical instrument 82 one uses the digital picture that is generated to find the proper semiconductor component. To this end special software is used to analyze the picture and find the proper component. If the optical path 80 is not completely perpendicular to the wafer the software will not be able to find the right component. Thus it is required to tilt the corresponding digital camera with relation to the wafer to correct for any misalignment. Such a misalignment can easily happen since one commonly applies for example some kind of needle device, which pushes a semiconductor component that needs to be picked on a backside thereof to facilitate the release of said component from the foil of the wafer carrier. Both considerations above make the application of an apparatus according to the present invention very advantageous for this particular purpose. The apparatus does not require much space and allows a tilting of a camera mounted to it without a shift in focus point thereof. Moreover one can easily and accurately performs an adjustment by tilting the support unit with relation to the frame by hand while at the same time observing the picture of the digital camera.

Since both requirements as described in the previous paragraph (lack of room and perpendicular alignment) are important for many types of semiconductor processing systems, the apparatus according to the present invention can also advantageously be used for wire-bonders, die-bonders, tapers, die-sorters and probes.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The verb "comprise" and its conjugations do not exclude the presence of elements or steps other than those listed in any claim or the specification as a whole. The singular reference of an element does not exclude the plural reference of such elements or vice-versa.

The invention claimed is:

1. An apparatus for aligning an optical device and an object, the apparatus comprising:
    a frame;
    a support unit for supporting an optical device or an object;
    a transportation device arranged to at least tilt the support unit with relation to the frame;
    characterized in that, a segment of a sphere is provided, the segment defining a spherical surface, and that the tilting movement of the support unit is controlled by said spherical surface.

2. An apparatus as claimed in claim 1, characterized in that a first segment of a sphere and a second segment of a sphere are provided, the first segment of a sphere defining a first spherical surface and the second segment of a sphere defining a second spherical surface, the center of the sphere corresponding to the first spherical surface substantially coincides with the center of the sphere corresponding to the second spherical surface, and that the first and the second spherical surface are movable with relation to each other.

3. An apparatus as claimed in claim 1, characterized in that a locking device is provided, the locking device arranged to respectively change the apparatus between a locked condition wherein the support unit is locked with relation to the frame and a released condition wherein the support unit is movable with relation to the frame.

4. An optical instrument comprising an apparatus according to claim 1 and an assembly of lenses mounted to the support unit of said apparatus.

5. A semiconductor process system, which comprises:
    a machine frame;
    a carrier for accommodating semiconductor components;
    a tool to process the semiconductor components;
    an apparatus according to claim 1, the apparatus is mounted to the process system with its frame;
    an assembly of lenses mounted to the support unit of said apparatus.

6. The apparatus of claim 1, wherein a focal point of the optical device is located at the center the sphere.

7. The apparatus of claim 1, wherein the transportation device is arranged to tilt the support unit and the optical device, with relation to the frame, into a plurality of positions having the same focal point.

8. The apparatus of claim 1, wherein the support unit may be tilted in a plurality directions in relation to the frame.

9. An apparatus as claimed in claim 2, characterized in that the first spherical surface couples with the second spherical surface when the first and the second segment move with relation to each other.

10. An apparatus as claimed in claim 2, characterized in that the frame comprises the first segment of a sphere and the transportation device comprises the second segment of a sphere, and that the second spherical surface is movable along the first spherical surface.

11. An optical instrument as claimed in claim 4, characterized in that the apparatus is mounted to a microscopic instrument with its frame, the microscopic instrument comprising a stage for holding an object, the stage being movable with relation to the assembly of lenses in at least one direction.

12. An apparatus as claimed in claim 10, characterized in that the locking device comprises a locking plate, the locking plate locking and releasing the second segment of a sphere to the first segment of a sphere when changing to the locked condition and the released condition respectively.

13. A semiconductor process system comprising:
    a machine frame;
    a carrier configured to accommodate a semiconductor wafer disposed on a foil and holding a plurality of semiconductor components;
    a tool to process the semiconductor components, the tool configured to pick and place individual semiconductor components from the wafer and place them on an external member for packaging;
    an apparatus according to claim 1, the apparatus mounted to the process system with its frame; and
    an alignment apparatus having a frame, a support unit, an optical device having an assembly of lenses mounted to the support unit, and a transportation device arranged to at least tilt the support unit with relation to the frame, the alignment apparatus characterized in that a segment of a sphere is provided, this segment defining a spherical surface, and that the tilting movement of the support unit is controlled by said spherical surface.

14. An apparatus for aligning an optical device and an object, the apparatus comprising:
    a frame, configured to support the object at a first point;
    a support unit for supporting an optical device;
    a first spherical segment fixed in relation to the support unit; and
    a second spherical segment fixed in relation to the frame, the first and second spherical segments corresponding to surfaces of respective spheres having center points at the first point, and the first spherical segment being coupled to move along the second spherical segment to adjust the orientation of the optical device with relation to the object while maintaining a fixed focal point at said first point.

15. An apparatus as claimed in claim 14, further including a locking plate configured to respectively lock and release the second segment of a sphere to and from the first segment of a sphere when changing to respective locked and released conditions.

* * * * *